United States Patent

Galanti

[15] 3,693,052

[45] Sept. 19, 1972

[54] ELECTRICAL COMPONENT MOUNTING

[72] Inventor: Frank Galanti, Reseda, Calif.

[73] Assignee: Warwick Electronics Inc., Chicago, Ill.

[22] Filed: April 15, 1971

[21] Appl. No.: 134,168

[52] U.S. Cl. ............317/101 CC, 29/626, 174/68.5, 339/17 C

[51] Int. Cl. ............H05k 1/18

[58] Field of Search ......174/68.5; 317/101 B, 101 C, 317/101 CC, 101 CM, 101 CE, 101 R; 339/17 R, 17 C, 18 R, 18 B, 275 B; 29/626

[56] References Cited

UNITED STATES PATENTS

| | | | |
|---|---|---|---|
| 3,155,767 | 11/1964 | Schellack | 174/68.5 |
| 3,302,068 | 1/1967 | Warman et al. | 317/101 CE |

FOREIGN PATENTS OR APPLICATIONS

| | | | |
|---|---|---|---|
| 886,481 | 8/1953 | Germany | 174/68.5 |
| 869,604 | 5/1961 | Great Britain | 317/101 R |

*Primary Examiner*—Darrell L. Clay
*Attorney*—Jessup & Beecher

[57] ABSTRACT

The connection of an electrical component to a printed circuit board wherein a lead to the component includes an offset being in frictional engagement with the walls of an opening within the circuit board, the apex of the offset being soldered to be able to electrically connect the lead to the printed circuit path on the underside of the board, the free end of the lead extending exteriorly of the board on the upper surface thereof.

1 Claim, 4 Drawing Figures

INVENTOR.
FRANK GALANTI
BY JESSUP & BEECHER
Warren T. Jessup
ATTORNEYS

ELECTRICAL COMPONENT MOUNTING

BACKGROUND OF THE INVENTION

The apparatus of this invention relates to electrical circuitry and more particularly to the mounting of an electrical component upon a printed circuit board.

A printed circuit board is a generic term applied to a rigid planar section of electrically non-conductive material which is employed in the fabrication of electrical circuits. Basically, a particular array of electrically conducting circuit paths are established on the board by any of several well known graphic art processes. Electronic components such as resistances, inductances, and capacitances are to be secured and supported upon the board and are adapted to be electrically connected to certain circuit paths of the board. Wire like leads extend from the components and are employed not only to facilitate the securement of the component to the board but also to effect the electrical connection to the circuit path.

Printed circuit boards make economically possible mass production of electronic apparatuses. Additionally, circuit boards save space and weight and substantially increase the reliability of electronic equipment. The circuit boards are used in practically all types of electronic equipment such as radio and television sets, electrical wiring, behind the dashboard in automobiles, guided missile and airborne electronic equipment, computers and industrial control equipment.

The normal construction of printed circuit boards is to form the printed circuit on one side of the board with the components being located on the opposite side of the board. The leads of the component extend through apertures within the board and are electrically connected as by solder to their respective printed circuit paths. The leads of the components are connected to the respective circuit path normally by means of the dip soldering technique. Basically, the dip soldering technique exposes the free ends of the lead and its circuit path to molten solder, with such being joined in a single precisely controlled operation. Such a technique is extremely reliable and has substantially helped to minimize a major cause of unreliability in electronic equipment.

Within printed circuit boards it is desirable in certain instances to electrically connect a component exteriorly of the board even though it has been electrically connected to printed circuit paths on the board. Within the conventional printed circuit board the free ends of each of the components have been extended through apertures in the boards from the component side of the board and has been soldered to circuit paths on the circuit side of the board. To then extend a lead of a component exteriorly of the board is not easily accomplished while also running the risk that the lead may come into contact with a circuit path to which it is desired that the lead not be electrically connected therewith.

To locate a conductor on the component side of the board to be connected to a lead of a particular component also runs a similar risk of establishing a short circuit with a lead of another component to which it is desired to not be connected.

It would be desirable to form the lead of a component in such a manner as to facilitate the electrical connection of such to a printed circuit path on the underside of a printed circuit board, while also permitting the lead to extend exteriorly of the upper surface (or component side) of the board to facilitate electrical connection of the component to an outside source.

SUMMARY OF THE INVENTION

The apparatus of this invention relates to the employment of a printed circuit board upon the underside of which has been formed a plurality of printed circuit paths. Electrical components are to be locatable on the opposite side or upper surface of the board with the wire like leads of the components to extend through apertures formed in the board and be electrically connectible by solder to predetermined circuit paths formed on the underside of the board. At least one of the leads of the component including an offset. The offset to be in frictional engagement with the walls of an opening within the board. The solder is to electrically connect the apex of the offset to its respective circuit path. The free end of the lead extending from the offset is adapted to extend adjacent the upper surface of the board and exteriorly of the periphery of the board. The free end of the lead then facilitates its electrical connection to an outside source.

DETAILED DESCRIPTION OF THE SHOWN EMBODIMENT

Figures 1, 4:
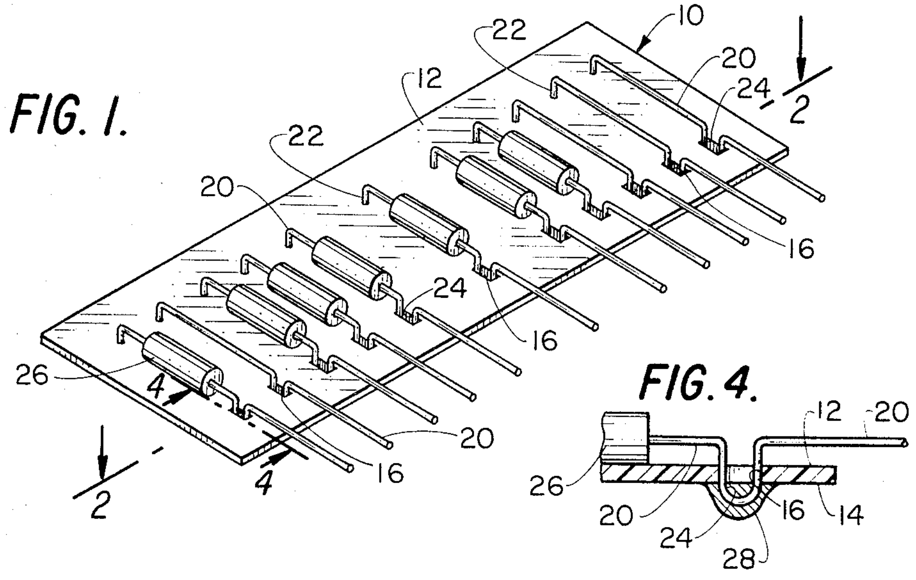
FIG. 1 is a perspective view of the component side of a printed circuit board wherein the leads are constructed in accordance with this invention.
FIG. 4 is a fragmentary cross-sectional view of a single offset of an electrical lead taken along line 4—4 of FIG. 1.
Figure 2:
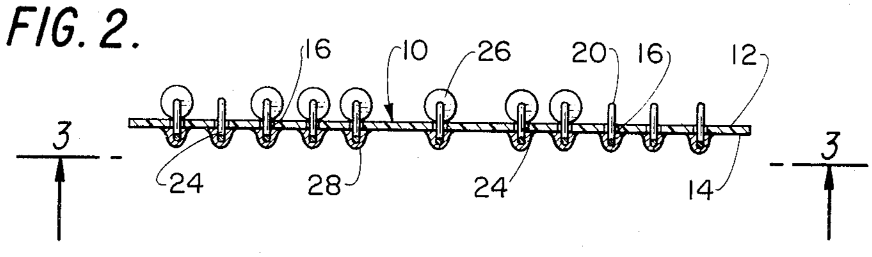
FIG. 2 is a cross sectional view through the offset portion of the leads of this invention taken along line 2—2 of FIG. 1.
Figure 3:
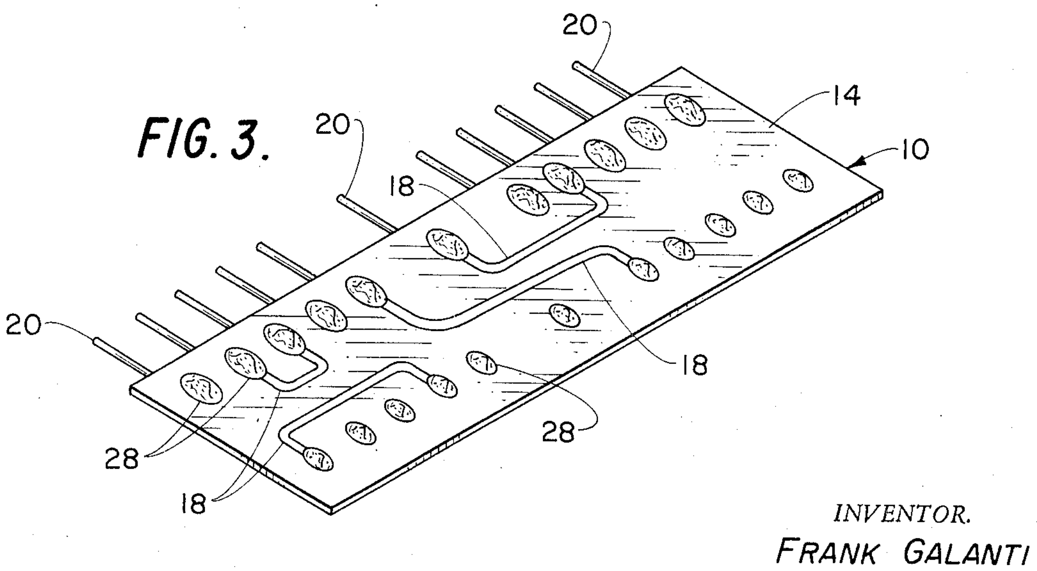
FIG. 3 is a bottom view of the underside of the printed circuit board taken along line 3—3 of FIG. 2.

Referring particularly to the drawing there is shown in FIG. 1 a printed circuit board 10 having an upper surface 12 and an underside 14. The board 10 is to be constructed in any conventional circuit board construction. The primary consideration of any circuit board construction is that the circuit board itself is to be formed of a non-electrically conductive material such as a plastic resin or other similar material.

Formed through the board 10 are a plurality of openings 16. Openings 16 are formed in a particular location so as to either selectively cooperate with or not with a circuit path 18 formed on the underside 14 of the board 10. Each of the circuit paths 18 are to be formed thereon by means of conventional processes in their desired locations. Conventional processes such as material removal processes are well known and in common use in the forming of printed circuit paths upon printed circuit boards.

A plurality of wire-like leads 20 are to be securable adjacent the upper surface of the board 12. The first end 22 of each of the leads 20 is adapted to pass through a single opening 16 and protrude from the underside 14 of the board 10. By the selection of the position of the opening 16, the first end 22 of each of the leads 20 may or may not come into contact with a circuit path 18. A U-shaped offset 24 is also formed within the lead 20 with the offset 24 being adapted to pass through an opening 16. It is to be noted that the opening 16 which cooperates with the offset 24 is larger in size than the opening 16 which cooperates with the first end 22.

Each offset 24 is adapted to frictionally engage the walls of its respective opening 16. This frictional engagement is to also be slightly resilient thereby upon the insertion of each offset 24 within its respective opening 16, such is fixedly retained with respect to the circuit board 10. A portion of each of the leads 20 extend from its respective offset 24 adjacent the upper surface 12 and beyond the periphery of the circuit board 10. This extension of each of the leads facilitates electrical connection of a lead 20 to an outside source (not shown). A typical outside source would be a source of electrical energy or connectible to an electrical component such as a resistor, capacitor, or inductor.

An electrical component 26 may be associated with a lead 20 between the first end 22 thereof and the offset 24. Although it is envisioned that normally the leads 20 that are formed according to the aspects of this invention will include the use of a component 26, such is not considered to be mandatory and the inventor does not wish to be specifically limited thereto.

Upon the circuit board 10 being arranged as desired with the leads 20 located thereon in the desired position and with the components 26 located in the desired position, solder is exposed to the underside 14 permitting a puddle 28 of solder to form about portions of each of the leads 20 which extend to the underside 14. In other words, solder is formed around the termination of each first end 22 and also the apex of each offset 24. If either a first end 22 or an offset 24 communicates with a circuit path 18, the puddle 28 will function to electrically connect such to the circuit path. As a result, the puddle 28 serves to connect the lead 20 to the circuit board 10 and also serves to anchor each lead 20 to the board 10.

The primary advantage of the apparatus of this invention is that a component lead may be electrically connected to a printed circuit path and also the same component lead may be extended to be employed as off-board connectors. Additionally, another significant advantage of the apparatus of this invention is that during the soldering of the sections of the lead on the underside 14 of the board 10, the solder is not permitted to come into contact and cling to the free end of the lead which extends exteriorly of the board. This unencumbering of the off-board section of the lead 20 with solder facilitates the off-board connection. Further, the formation of the boards 10 including the offset lead of this invention makes possible mass production because the entire underside 14 of the board 10 can be subjected to solder when using the dip soldering technique.

What is claimed is:

1. In combination with a printed circuit board, said board having an upper surface and a lower surface, said lower surface having a printed circuit path formed thereon, openings formed within said board between said upper surface and said lower surface, a component connection comprising:

a wire-like lead adapted to conduct electricity, said lead having a first end, an offset, and a free end, said offset being located intermediate said first end and said free end, and within one of said openings, and having sides and an apex connecting the sides, said free end of said lead being located upon said upper surface and extending beyond the periphery of said board;

said apex of said offset extending slightly past said lower surface;

said sides of said offset being in frictional engagement with the side walls of a said opening;

a solder attachment electrically connecting said offset with said printed circuit path; and an electrical component connected to said lead and located intermediate said offset and said first end;

said first end residing in another one of said openings.

* * * * *